United States Patent
Rose et al.

(10) Patent No.: US 11,769,660 B2
(45) Date of Patent: Sep. 26, 2023

(54) METHOD AND APPARATUS FOR REMOVING PARTICLES FROM THE SURFACE OF A SEMICONDUCTOR WAFER

(71) Applicant: NCC NANO, LLC, Dallas, TX (US)

(72) Inventors: David Alex Rose, Seoul (KR); Kurt A. Schroder, Coupland, TX (US)

(73) Assignee: PulseForge, Inc., Austin, TX (US)

(*) Notice: Subject to any disclaimer, the term of this patent is extended or adjusted under 35 U.S.C. 154(b) by 0 days.

(21) Appl. No.: 17/541,925

(22) Filed: Dec. 3, 2021

(65) Prior Publication Data
US 2023/0178363 A1 Jun. 8, 2023

(51) Int. Cl.
| | |
|---|---|
| *H01L 21/02* | (2006.01) |
| *B08B 3/04* | (2006.01) |
| *B08B 7/00* | (2006.01) |
| *H01L 21/687* | (2006.01) |
| *B08B 7/04* | (2006.01) |
| *B08B 3/08* | (2006.01) |
| *B08B 5/02* | (2006.01) |

(52) U.S. Cl.
CPC .......... *H01L 21/02057* (2013.01); *B08B 3/041* (2013.01); *B08B 3/08* (2013.01); *B08B 5/023* (2013.01); *B08B 7/0035* (2013.01); *B08B 7/0042* (2013.01); *B08B 7/04* (2013.01); *H01L 21/68764* (2013.01)

(58) Field of Classification Search
CPC ......... H01L 21/02057; H01L 21/68764; B08B 3/041; B08B 3/08; B08B 5/023; B08B 7/0035; B08B 7/0042; B08B 7/04
See application file for complete search history.

(56) References Cited

U.S. PATENT DOCUMENTS

| | | | | |
|---|---|---|---|---|
| 6,143,087 | A * | 11/2000 | Walter ..................... | B08B 3/12 134/1 |
| 11,621,175 | B1 * | 4/2023 | Rose et al. ......... | H01L 21/6704 134/1.3 |
| 2004/0011378 | A1 * | 1/2004 | Jackson ............... | B08B 7/0057 134/1 |
| 2004/0182416 | A1 * | 9/2004 | Allen et al. .......... | B08B 7/0035 134/1 |
| 2006/0060213 | A1 * | 3/2006 | Huber et al. ......... | B08B 7/0042 134/2 |

(Continued)

FOREIGN PATENT DOCUMENTS

| | | | |
|---|---|---|---|
| TW | I278927 B * | 4/2007 | |
| WO | 9937124 A1 * | 7/1999 | ................. H05B 41/34 |

OTHER PUBLICATIONS

J. Graf, Laser cleaning of particles from silicon wafers: capabilities and mechanisms, First publ. in: Solid State Phenomena 103-104 (2005), pp. 185-188.

(Continued)

*Primary Examiner* — Sharidan Carrillo
(74) *Attorney, Agent, or Firm* — Antony P. Ng; Russell Ng PLLC (57) ABSTRACT

A method for removing particles from a semiconductor wafer surface is disclosed. A wafer is being spun on a spin coater contained within a condensing environment. Liquid vapor is then infused into the condensing environment to allow some of the liquid vapor to be condensed onto a surface of the wafer on which particles may adhere while the wafer is being spun. Next, a set of light pulses is applied to the surface of the spinning wafer. Finally, an air stream is utilized to carry the particles off the surface of the wafer.

5 Claims, 7 Drawing Sheets

(56) References Cited

U.S. PATENT DOCUMENTS

| | | | | |
|---|---|---|---|---|
| 2014/0273454 | A1* | 9/2014 | Huang et al. | H01L 21/67051 |
| | | | | 134/102.1 |
| 2014/0278188 | A1* | 9/2014 | Yuditsky et al. | G01N 21/9501 |
| | | | | 702/151 |
| 2015/0128991 | A1* | 5/2015 | Brown et al. | H01L 21/67115 |
| | | | | 134/1 |
| 2015/0136186 | A1* | 5/2015 | Brown | H01L 21/67051 |
| | | | | 134/113 |
| 2020/0194284 | A1* | 6/2020 | Park et al. | H01L 21/6708 |

OTHER PUBLICATIONS

W. Zapka, et al., LASER CLEANING OF WAFER SURFACES AND LITHOGRAPHY MASKS, Microelectronic Engineering 13 (1991) 547-550.

* cited by examiner

METHOD AND APPARATUS FOR REMOVING PARTICLES FROM THE SURFACE OF A SEMICONDUCTOR WAFER

RELATED PATENT APPLICATION

The present patent application is related to co-pending applications:
U.S. Serial No. 17/541,877, filed on even date; and
U.S. Serial No. 17/541,953, filed on even date.

TECHNICAL FIELD

The present application relates to method and apparatus for processing integrated circuits in general, and, in particular, to a method and apparatus for removing particles from the surface of a semiconductor wafer.

BACKGROUND

One of the main sources of defects in electronic devices is particle contamination on the surface of a wafer or panel during fabrication of electronic devices on a semiconductor wafer. There are many origins of the particles. Some are from previous processes and some are introduced from external sources.

Much of the cost of building a clean room is centered around reducing the number of airborne particles within the clean room. Despite all the efforts to keep particles out of the clean room, particles are still able to make their way onto the surface of wafers during device manufacturing. Regardless of their origin, it is imperative to remove particles as they interfere with device fabrication and contribute to defects in the electronic devices. Hence, most of the processes in semiconductor manufacturing are relating to cleaning.

Different methods can be utilized to remove particles already settled on a wafer surface, depending on the particle composition, size, adhesiveness, etc. For example, large particles that are poorly adhered to a wafer surface can be removed by a jet of air. Mechanical means, such as wiping with a cloth, may sometimes be utilized. Non-contact techniques, such as solvents, may be employed when the surfaces to be cleaned are too easily to be scratched. Reactive solvents, such as piranha etch or RCA process, can also be utilized to dissolve particles. They are particularly useful when the particles are of an organic nature. The wet techniques can be enhanced by the usage of ultrasonic cleaning. In contrast, dry, non-contact methods of particle removal may include plasma treatment, ultraviolet ozone, etc.

Despite a plethora of methods employed to remove particles from wafer surfaces, particle removal continues to be a problem. Particle removal becomes even more important as the feature size of electronic devices decreases while the number of steps in the fabrication process increases. Very tiny particles have always been present in various stages of the manufacturing process, but their removal was far less important than when the devices were larger. As particles become smaller, their surface area to mass ratio increases. This means that the adhesive force per particle mass of the particle to the surface increases. This, combined with the fact that the particle is smaller, means the shear force necessary to dislodge the particle from a surface increases. Simultaneously, structures on the surface in the presence of the particles are more easily damaged as they become smaller. So, it is a two-pronged problem in that traditional techniques for removing small particles from a wafer surface are not only inadequate but they can also damage devices on the wafer surface as well. Additionally, many particle removal technologies produce by-products that are environmentally unfriendly. Thus, it would be desirable to have little or no by-products from the particle cleaning process.

The present disclosure provides an improved method and apparatus for removing particles from the surface of a semiconductor wafer.

SUMMARY OF THE INVENTION

In accordance with one embodiment, a wafer is being spun on a spin coater contained within a condensing environment. Liquid vapor is then infused into the condensing environment to allow some of the liquid vapor to be condensed onto a surface of the wafer on which particles may adhere while the wafer is being spun. Next, a set of light pulses is applied to the surface of the spinning wafer. Finally, an air stream is utilized to carry the particles off the surface of the wafer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The reason small particles are particularly difficult to remove from a surface is because of two effects. First, the surface area to mass ratio of a particle increases as the particle becomes smaller, which means that if the particle is in contact with a surface, such as a wafer surface, the adhesion per unit length becomes larger. Second, it is very difficult to achieve any significant shear on the spatial scale of a tiny particle when attempting to apply a shear force to remove the particle. Thus, many techniques of removing particles from a surface are less effective for very small particles.

Three improved methods for removing small particles from the surface of a semiconductor wafer are described, as follows.

First Method

Figure 1:
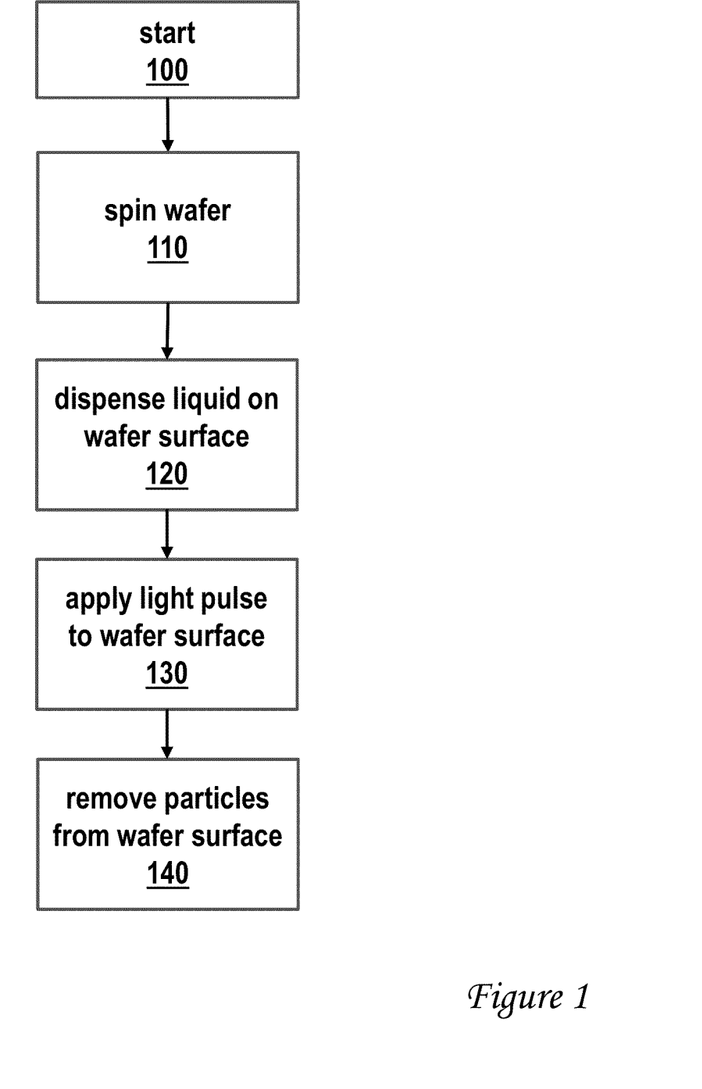
FIG. 1 is a flow diagram of a method for removing particles from the surface of a wafer, according to a first embodiment.

Referring now to the drawings and in particular to FIG. 1, there is depicted a flow diagram of a method for removing particles from the surface of a semiconductor wafer, such as a silicon wafer, according to a first embodiment. Starting at block 100, a wafer is being spun on a spin coater, as shown in block 110. Next, a small stream of liquid is continuously dispensed (puddle dispense) onto a surface of the wafer to which particles may adhere while the wafer is being spun, as depicted in block 120. Preferably, the liquid is dispensed near the center of the wafer surface. The liquid flows tangentially over the wafer surface due to the friction of the liquid with the spinning wafer, and the liquid also flows radially outward over the wafer surface due to centrifugal force.

Next, light pulses are repeatedly emitted onto the surface of the wafer over liquid while liquid is being dispensed on the spinning wafer, as shown in block 130. After the light pulse emissions, particles previously attached to the wafer surface can be easily removed from the wafer surface along with the flowing liquid, as depicted in block 140.

The liquid may be an inorganic solvent, such as water, or an organic solvent, such as alcohol. The liquid may contain chemicals, such as acids or detergents, to aid in the wetting of the liquid flowing over the wafer. The liquid is important to this method for two reasons, namely, a source of gas bubbles generated by the heating of a particle by light pulses, and acts as a heat sink to prevent the wafer surface from heat damage. The boiling point and heat of vaporization of the liquid are among the variables that determine at what point in time the gas bubble is generated due to heating by the pulse of light.

Figure 2:
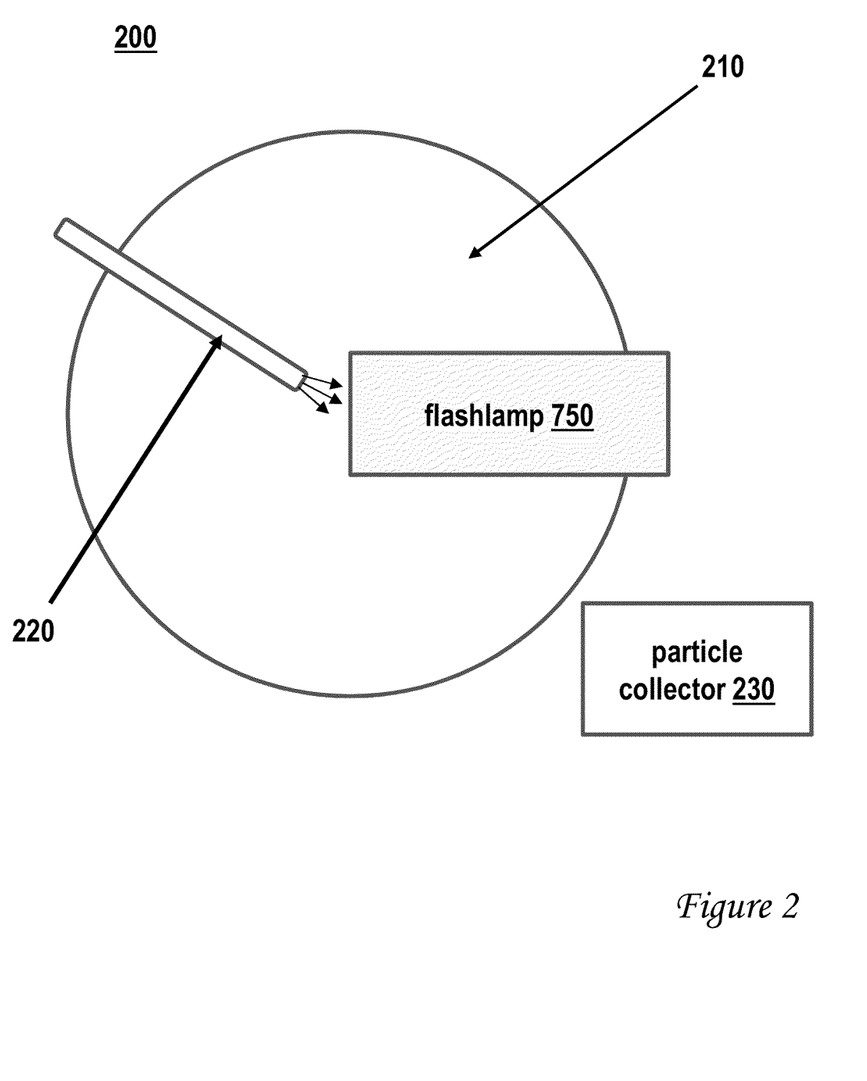
FIG. 2 is a diagram of an apparatus for removing particles from the surface of a wafer, according to the method shown in FIG. 1.

With reference now to FIG. 2, there is depicted a diagram of an apparatus for removing particles from the surface of a semiconductor wafer, such as a silicon wafer, according to the method shown in FIG. 1. As shown, an apparatus 200 includes a spin coater 210, a liquid dispenser 220, a particle collector 230, and a flashlamp 750. Spin coater 210 includes a vacuum chuck to hold the wafer down. An adhesive or a retaining device can be utilized to secure a wafer onto spin coater 210.

Liquid dispenser 220 dispenses fluid on the surface of the wafer while the wafer is being spun by spin coater 210. The fluid dispensed from liquid dispenser 220 can be metered with a constant displacement pump (such as a peristaltic pump) or controlled with a mass flow controller that can be switched on and off via a solenoid. The rotational speed of spin coater 210 as well as the metering rate of the flowing liquid can be controlled by using a specific ramp-up and ramp-down profile.

Flashlamp 750 irradiates the surface of the wafer with light pulses as the wafer is being spun by spin coater 210. It would be desirable to have a flashlamp with an irradiation area at least as big as the surface area of the wafer such that the entire wafer can be irradiated with a single pulse of light. But most likely, the flashlamp irradiation area is much smaller than the wafer. For example, the irradiation area of flashlamp 750, as shown in FIG. 2, has a length of about half the wafer's diameter but a narrow width. Since the wafer is being spun at a very high rate, such as 2,400 revolutions per minute (rpm), the flashlamp may not be able to deliver light pulse fast enough to cover the entire wafer within one single rotation of the wafer. This limitation may be caused by slow charging speed of the capacitors within the flashlamp or other factors. In order to overcome the above-mentioned limitation, flashlamp 750 is set to deliver consecutive pulses, each at a predetermined angular location when a minimum amount of time has lapsed as determined by the charging rate of the capacitors within flashlamp 750 or the maximum firing thermal limit of flashlamp 750 is reached, whichever is shorter, until the entire wafer surface has received at least one light pulse. Basically, the wafer has to complete at least one rotation between two consecutive light pulses, and the number of rotations increases as the rpm of the wafer increases.

The angular position of the wafer and the number of rotations can be determined by using an encoder (not shown) connected to an axle of spin coater 210. The encoder can be optical, magnetic, or mechanical. The angular position of the wafer is sent to a flashlamp controller of flashlamp 750, and the delivery of each subsequent light pulse can occur when the minimum amount of time has lapsed and the wafer has reached the predetermined angular position. Since the irradiation area of the flashlamp is not in a wedge shape, the center of the wafer will receive more light exposure than the perimeter of the wafer, but a minimum number of exposures will be received across the entire wafer.

Instead of using flashlamp 750, light pulses may also be provided by a laser (not shown). Since the size of a laser beam is generally very small, the laser beam may be scanned in a radial direction, from the center of the wafer to the edge of the wafer while the wafer is being spun in order to expose the entire wafer with a specified number of light pulses. Additionally, the radial position of the laser must be encoded as well and the position is indexed as each annulus is processed. As the radius is increased, the number of required pulses increases as well since the annulus area increases as the radius increases. Alternatively, if the laser beam can be expanded to a line at least half the diameter of the wafer, the above-mentioned scheme employed by flashlamp 750 may be used as the laser no longer needs to be indexed radially.

The light pulses can locally heat a particle if the radiant power is high enough to overcome the heat transfer from the particle to the surrounding liquid during irradiation. If the heating rate is high enough, and the particle is small (less than 100 nm) and somewhat absorptive of the light pulses, it is possible to heat the particle to a point that the particle will become hot enough to vaporize the liquid adjacent to it. The absorption of the light may also be at the surface of the wafer. If the particle is adjacent to the surface of the wafer, or even another particle, the vaporization will preferentially initiate, or nucleate, in the gap between the particle and the wafer surface. As a result, a gas bubble is rapidly formed in this gap, and an associated increase in local pressure at that site is formed. This has the effect of lifting the particle off the wafer surface. After the particle is no longer being heated by the light, the bubble collapses, and if the particle were not lifted from the surface of the wafer by the expansion of the gas bubble, the collapse of the gas bubble causes an increase in local pressure between the particle and the wafer surface to lift the particle off the wafer surface, and the particle becomes suspended in the liquid. Consequently, if the liquid is flowed transverse to the surface, e.g., across the wafer surface, during irradiation, the released particle can be swept away by the liquid flow, and be collected by particle collector 230.

After the completion of light exposure and fluid dispensing has ceased, a flow of dry gas may be directed to the wafer, preferably near the center of the wafer to dry it before the removal of the wafer from spin coater 210. The wafer may still be spinning during gas dispense to encourage flow of the gas along the wafer. The gas may additionally be heated to encourage evaporation of any vapor which may still be on the wafer after processing and to discourage any condensation of new vapor on the wafer. The wafer may additionally be heated by operating flashlamp 750 at a low power either in continuous or pulsed mode.

Second Method

The second method is similar to the first method except that liquid is being introduced in a vapor phase, and may be in a condensing environment.

Figure 3:
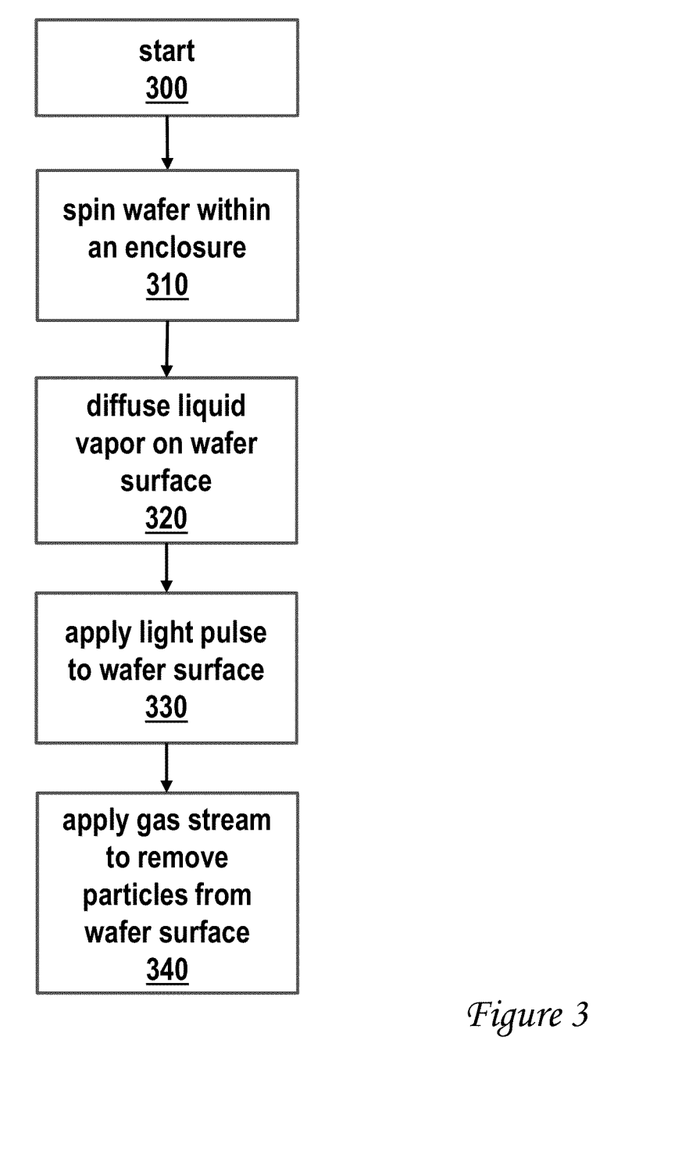
FIG. 3 is a flow diagram of a method for removing particles from the surface of a wafer, according to a second embodiment.

Referring now to FIG. 3, there is depicted a flow diagram of a method for removing particles from the surface of a semiconductor wafer, such as a silicon wafer, according to a second embodiment. Starting at block 300, a wafer is being spun on a spin coater within an enclosure having a controlled (condensing) atmosphere, as shown in block 310. The wafer may be slightly cooled with respect to the rest of the environment within the enclosure. Next, a small amount of liquid in a vapor phase is diffused into the enclosure in which the wafer is being spun, as depicted in block 320, such that some liquid will condense at a gap between the particle and the surface of the wafer.

In the case in which neither the particle nor the surface is particularly absorptive of the beam, an absorptive liquid may be used. An example of a liquid which absorbs some of the emission from a flashlamp is acetone. The absorptive liquid is introduced in a vapor phase within the condensing environment.

Light pulses are repeatedly illuminated onto the surface of the wafer within the enclosure while liquid is being condensed on the spinning wafer, as shown in block 330. When irradiated by light pulses, the liquid in the gap is vaporized and the particle is lifted from the surface of the wafer. While the light is pulsing, a gas stream, preferably directed near the center of the wafer and with flow parallel to the wafer surface may be utilized to sweep the particles off the wafer surface, as depicted in block 340. The gas stream, containing the particles may be exhausted. Alternatively, a filter may be placed in the gas stream to collect the particles and to allow for recycling of the gas in the controlled atmosphere.

Figure 4:
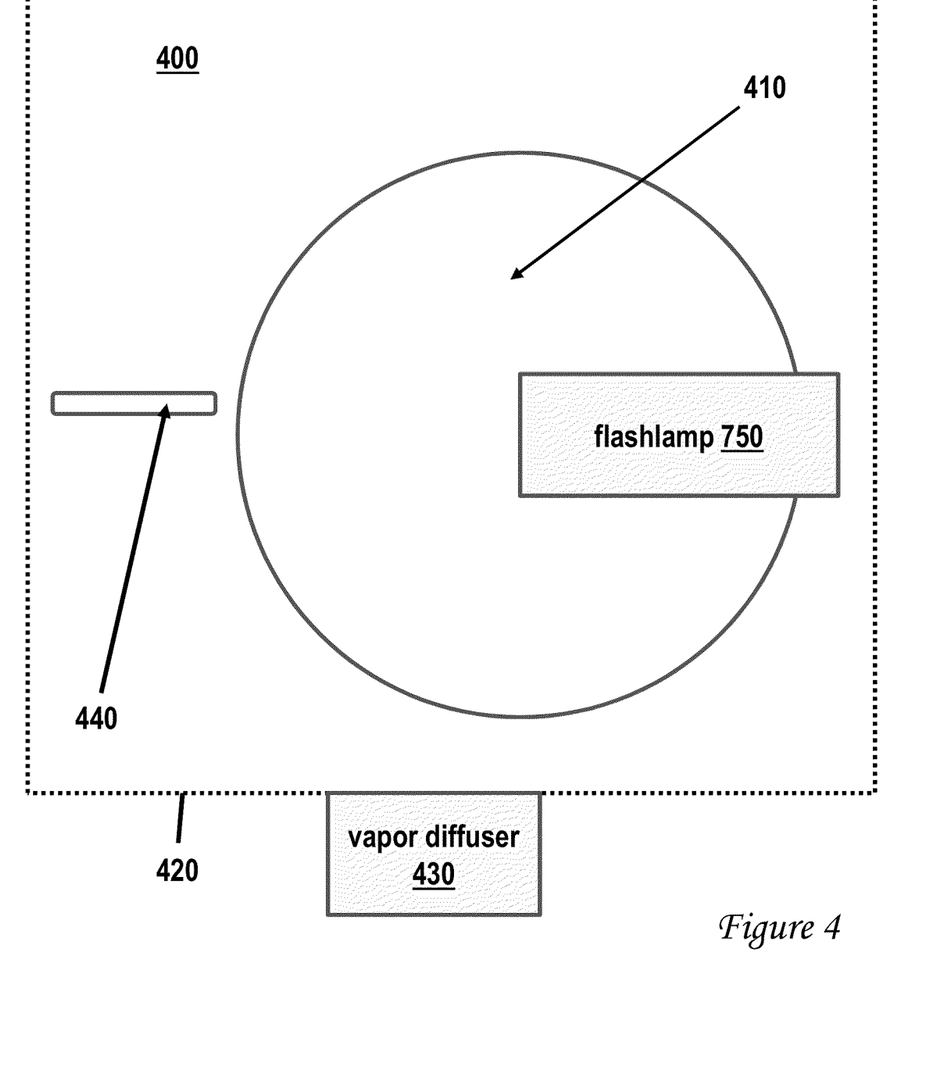
FIG. 4 is a diagram of an apparatus for removing particles from the surface of a wafer, according to the method shown in FIG. 3.

With reference now to FIG. 4, there is depicted a diagram of an apparatus for removing particles from the surface of a semiconductor wafer, according to the method shown in FIG. 3. As shown, an apparatus 400 includes a spin coater 410, an enclosure 420 in which atmosphere can be controlled, a vapor diffuser 430, an air blower 440, and flashlamp 750. Spin coater 410 includes a vacuum chuck to hold the wafer down. An adhesive or a retaining device can be utilized to secure a wafer onto spin coater 410. The rotational speed of spin coater 410 can be controlled by using a specific ramp-up and ramp-down profile.

Flashlamp 750 irradiates the surface of the wafer with light pulses as the wafer is being spun by spin coater 410. Since the irradiation area of flashlamp 750 has a length of about half the wafer's diameter and a narrow width, flashlamp 750, which remains stationery, is set to deliver consecutive light pulses, each at a predetermined angular location when a minimum amount of time has passed as determined by the charging rate of the capacitors within flashlamp 750 or the maximum firing thermal limit of flashlamp 750 is reached, whichever is shorter, until the entire wafer surface has received at least one light pulse. Basically, the wafer has to complete at least one rotation between two consecutive light pulses.

The angular position of the wafer and the number of rotations can be determined by using an encoder (not shown) connected to an axle of spin coater 410. The encoder can be optical, magnetic, or mechanical. The angular position of the wafer and the number of rotations are sent to a flashlamp controller of flashlamp 750, and the delivery of each light pulse can occur when the minimum amount of time has lapsed.

Instead of using flashlamp 750, light pulses may also be provided by a laser (not shown). Since the size of a laser beam is generally very small, the laser beam may be scanned in a radial direction, from the center of the wafer to the edge of the wafer while the wafer is being spun in order to expose the entire wafer with a specified number of light pulses. Additionally, the radial position of the laser must be encoded as well and the position is indexed as each annulus is processed. As the radius is increased, the number of required pulses increases as well since the annulus area increases as the radius increases. Alternatively, if the laser beam can be expanded to a line at least half the diameter of the wafer, the above-mentioned scheme employed by flashlamp 750 may be used as the laser no longer needs to be indexed radially.

Third Method

The third method is similar to the second method except that a different equipment is utilized to remove the loosened particles in a condensing environment.

Figure 5:
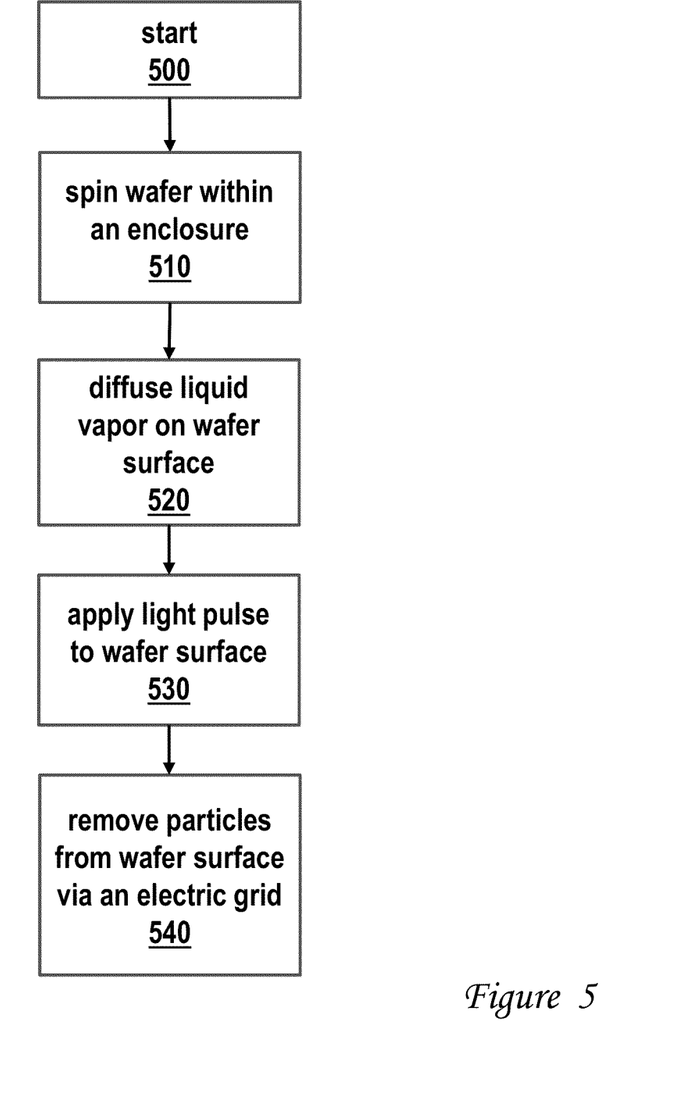
FIG. 5 is a flow diagram of a method for removing particles from the surface of a wafer, according to a third embodiment.

Referring now to FIG. 5, there is depicted a flow diagram of a method for removing particles from the surface of a semiconductor wafer, such as a silicon wafer, according to a third embodiment. Starting at block 500, a wafer is being spun on a spin coater within an enclosure having a controlled (condensing) atmosphere, as shown in block 510. The wafer may be slightly cooled with respect to the rest of the environment within the enclosure. Next, a small amount of liquid in a vapor phase is diffused into the enclosure in which the wafer is being spun, as depicted in block 520, such that some liquid will condense at a gap between the particle and the surface of the wafer.

In the case in which neither the particle nor the surface is particularly absorptive of the beam, an absorptive liquid such as acetone may be used. The absorptive liquid is introduced in a vapor phase within the condensing environment.

Light pulses are repeatedly illuminated onto the surface of the wafer within the enclosure while liquid is being condensed on the spinning wafer, as shown in block 530. When irradiated by light pulses, the liquid in the gap is vaporized and the particle is lifted from the surface of the wafer. After the particle has been lifted, it is accelerated off the wafer surface by an electric grid, as depicted in block 540. The electric grid may be annular and positioned outside of the wafer so as to not physically block any of the light from the light source. The electric grid may be energized during application of the pulsed light.

Figure 6:
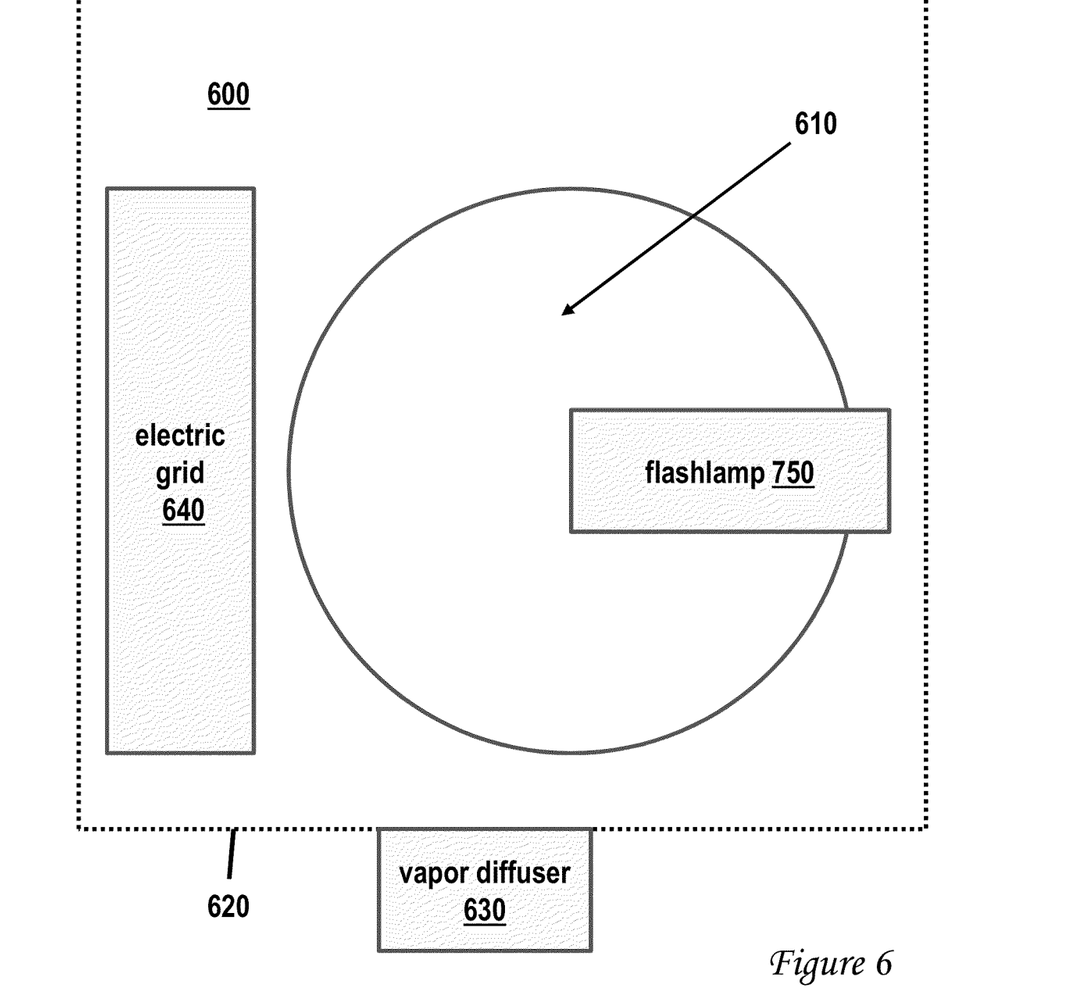
FIG. 6 is a diagram of an apparatus for removing particles from the surface of a wafer, according to the method shown in FIG. 5.

With reference now to FIG. 6, there is depicted a diagram of an apparatus for removing particles from the surface of a semiconductor wafer, according to the method shown in FIG. 5. As shown, an apparatus 600 includes a spin coater 610, an enclosure 620 in which atmosphere can be controlled, a vapor diffuser 630, an electric grid 640, and flashlamp 750. Spin coater 610 includes a vacuum chuck to hold the wafer down. An adhesive or a retaining device can be utilized to secure a wafer onto spin coater 610. The rotational speed of spin coater 610 can be controlled by using a specific ramp-up and ramp-down profile.

Electric grid 640 provides an electric potential between a wafer and electric grid 640 to accelerate particles to electric grid 640 after particles have been dislodged from the wafer surface. The wafer may be biased at one voltage, and electric grid 640 may be positioned off the side of the wafer and out of the beam from flashlamp 750. Electric grid 640 may also be disposed between flashlamp 750 and a wafer. Hence, the flashlamp beam shines through electric grid 640. This method for removing particles essentially forms an electrostatic precipitator.

Flashlamp 750 irradiates the surface of the wafer with light pulses as the wafer is being spun by spin coater 610. Since the irradiation area of flashlamp 750 has a narrow width and a length of about half the wafer's diameter, flashlamp 750, which remains stationery, is set to deliver consecutive light pulses, each at a predetermined angular location when a minimum amount of time has passed as determined by the charging rate of the capacitors within flashlamp 750 or the maximum firing thermal limit of flashlamp 750 is reached, whichever is shorter, until the entire wafer surface has received at least one light pulse. Basically, the wafer has to complete at least one rotation between two consecutive light pulses.

The angular position of the wafer and the number of rotations can be determined by using an encoder (not shown) connected to an axle of spin coater 610. The encoder can be optical, magnetic, or mechanical. The angular position of the wafer and the number of rotations are sent to a flashlamp controller of flashlamp 750, and the delivery of each light pulse can occur when the minimum amount of time has lapsed.

Instead of using flashlamp 750, light pulses may also be provided by a laser (not shown). Since the size of a laser beam is generally very small, the laser beam may be scanned in a radial direction, from the center of the wafer to the edge of the wafer while the wafer is being spun in order to expose the entire wafer with a specified number of light pulses. Additionally, the radial position of the laser must be encoded as well and the position is indexed as each annulus is processed. As the radius is increased, the number of required pulses increases as well since the annulus area increases as the radius increases. Alternatively, if the laser beam can be expanded to a line at least half the diameter of the wafer, the above-mentioned scheme employed by flashlamp 750 may be used as the laser no longer needs to be indexed radially.

Figure 7:
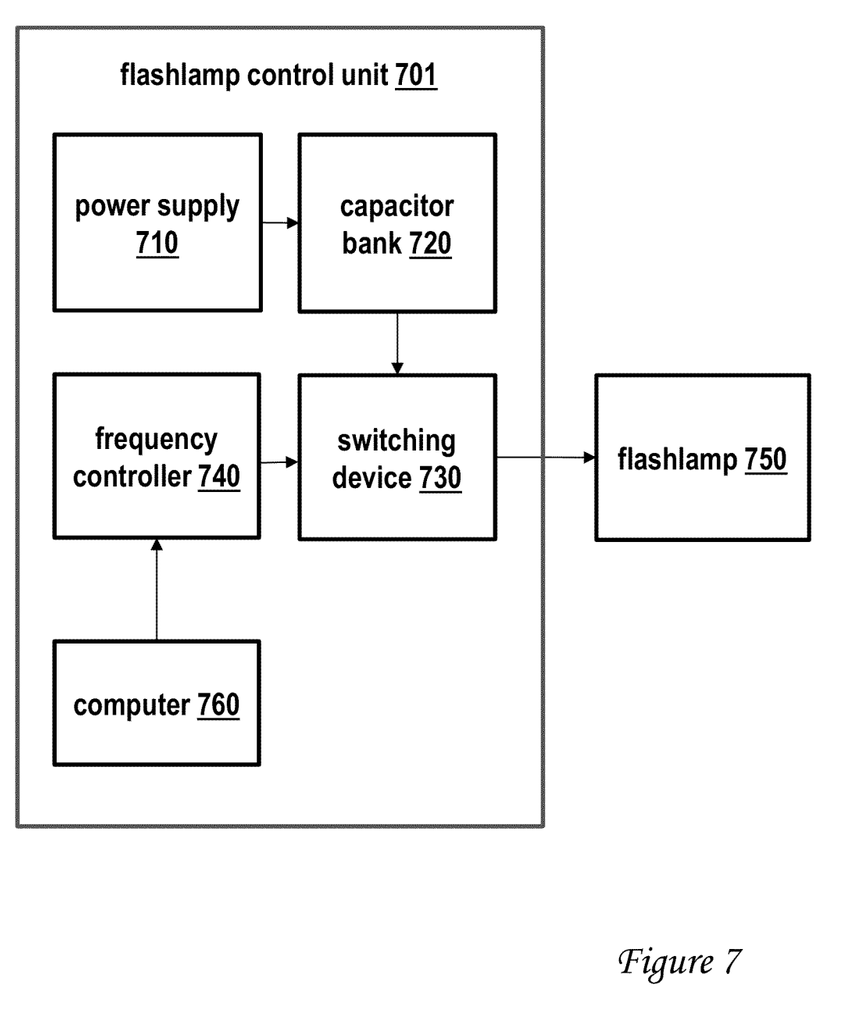
FIG. 7 is a block diagram of a flashlamp control unit for controlling a flashlamp within the apparatus from FIGS. 2, 4 and 6, according to one embodiment.

Referring now to FIG. 7, there is depicted a block diagram of a flashlamp control unit for controlling flashlamp 750, according to one embodiment. As shown, a flashlamp control unit 701 includes a capacitor-bank-charging power supply 710, a capacitor bank 720, an insulated gate barrier transistor (IGBT)-based switching device 730, a frequency controller 740, and a computer 760. Computer 760 includes a processor and various storage devices that are well-known to those skilled in the art. The capacitors in capacitor bank 420 are, for example, electrolytic capacitors. Capacitor bank 720 may alternatively be switched with a silicon controlled rectifier (SCR) switching device.

Capacitor bank 720 can be charged by capacitor-bank-charging power supply 710. Charges from capacitor bank 720 are then discharged into flashlamp 750 via IGBT-based switching device 730 while IGBT-based switching device 730 is being switched on-and-off repeatedly by frequency controller 740 during the discharge. Frequency controller 740 controls the gating of IGBT-based switching device 730 that, in turn, controls the switching frequency of the discharge. The repeated on-and-off switching of IGBT-based switching device 730 is intended to modulate the current flow from capacitor bank 720 to flashlamp 750, which in turn switches flashlamp 750 on and off. In other words, the frequency and pulse length of light pulses emitted by flashlamp 750 are dictated by frequency controller 740. By controlling the voltage and the pulse length of the light pulse, one can select the cavitation to occur at the particle-wafer surface interface and not on the wafer surface as a whole.

Flashlamp 750 can deliver a variable pulse length due to the fact that different particle sizes and types are released with differing difficulty. Thus, it is desirable to deliver the shortest pulse and highest intensity that will still remove the desired particles from the wafer surface.

As has been described, the present invention provides methods and apparatuses for removing particles on a semiconductor wafer. One advantage of this method is that it does not necessarily require the use of harsh or environmentally dangerous solvents.

The present invention becomes more effective as particles on a wafer become smaller. As particles become smaller, their radius of curvature increases. This further increases the discrimination (by lowering the power threshold) over the location where the nucleation of the gas bubbles will initiate over homogenous nucleation. That is, the high curvature of the gap between the small particles and the surface increases the likelihood of nucleation at that location over everywhere else, and it further increases the smaller the particles become. There is also a heating effect. When irradiated, smaller particles are heated at a greater rate, assuming similar absorption, than larger particles since the absorption of the light is proportional to the surface area of the particles. Additionally, the (thermal) mass of the particle is proportional to the mass of the particle. Thus, if a particle were a sphere of uniform density, the heating rate would be proportional to the surface area divided by the volume. This means that the heating rate of a particle scales as $1/r$, where $r$ is the radius of the particle. Thus, very small particles are heated at a much greater rate than larger ones as long as the heating rate is much greater than the leakage of heat from the particle to the surrounding environment. These two effects combined make a process that has automatic registration and is highly selective over other locations of the surface of a wafer.

While the invention has been particularly shown and described with reference to a preferred embodiment, it will be understood by those skilled in the art that various changes in form and detail may be made therein without departing from the spirit and scope of the invention.

What is claimed is:

1. A method for removing particles from a surface of a semiconductor wafer, said method comprising the steps of:
   providing a flashlamp controller in communication with a flashlamp;
   spinning a wafer within an enclosure having a condensing environment;
   infusing a liquid vapor into said enclosure having said condensing environment to allow some of said liquid vapor to be condensed onto a surface of said wafer on which particles adhere while said wafer is being spun;
   determining a number of rotations and an angular position on the surface of said spinning wafer by an encoder, wherein the angular position and the number of rotations are sent to the flashlamp controller;
   controlling the flashlamp with the flashlamp controller to emit a light pulse across an entire radius of said spinning wafer based on said determined angular position on said surface after a predetermined amount of time has lapsed, wherein the light pulse emitted is based on a charging rate of capacitors located in the flashlamp controller;

repeating said determining and controlling steps to emit another light pulse on said spinning wafer at another angular position on said surface until an entire surface of said spinning wafer has received at least one light pulse, wherein said spinning wafer has to complete at least one rotation between two consecutive light pulses; and removing said particles from said spinning wafer by allowing an air stream to carry said particles off said spinning wafer.

2. The method of claim 1, wherein said liquid vapor is acetone.

3. The method of claim 1, wherein said liquid vapor is water.

4. The method of claim 1, wherein said light pulse is emitted from said flashlamp across said entire radius of said spinning wafer simultaneously.

5. The method of claim 1, wherein said light pulse is emitted by said flashlamp at a stationary position.

* * * * *